United States Patent [19]
Loper

[11] Patent Number: 5,230,099
[45] Date of Patent: Jul. 20, 1993

[54] SYSTEM FOR CONTROLLING PHASE AND GAIN ERRORS IN AN I/Q DIRECT CONVERSION RECEIVER

[75] Inventor: Roger K. Loper, Marion, Iowa

[73] Assignee: Rockwell International Corporation, Calif.

[21] Appl. No.: 645,376

[22] Filed: Jan. 24, 1991

[51] Int. Cl.$^5$ .......................... H04B 1/30; H04B 1/10
[52] U.S. Cl. ..................................... 455/324; 455/303
[58] Field of Search ............... 375/39, 97, 98; 370/20; 455/60, 63, 67.3, 67.6, 214, 245.1, 304–306, 313, 314, 323, 324, 336

[56] References Cited

U.S. PATENT DOCUMENTS

| | | | |
|---|---|---|---|
| 4,587,710 | 4/1986 | Hansen | 375/97 |
| 4,633,315 | 12/1986 | Kasperkovitz | 358/188 |
| 4,799,212 | 1/1989 | Mehrgardt | 370/20 |
| 4,860,320 | 8/1989 | Hoffmann | 375/97 |
| 4,926,443 | 5/1990 | Reich | 375/102 |
| 4,953,182 | 8/1990 | Chung | 375/97 |
| 5,083,304 | 1/1992 | Cahill | 375/98 |
| 5,095,533 | 3/1992 | Loper et al. | 455/324 |
| 5,125,100 | 6/1992 | Katznelson | 455/63 |

FOREIGN PATENT DOCUMENTS

3938671A1  5/1990 Fed. Rep. of Germany .

OTHER PUBLICATIONS

Publication by Bolliger and Vollenweider in the *Proceedings of Fifth International Conference On Radio Receivers and Associated Systems*, Jul. 24–26, 1990, entitled "Some Experiments On Direct-Conversion Receivers".

Publication by Dickinson in the *Journal of the Institution of Electronic and Radio Engineers* vol. 56 No. 2, pp. 75–78, Feb. 1986, entitled "Digital Matching Of I and Q Signal Paths Of A Direct Conversion Radio".

Publication by Hickman in *Electronics World + Wireless World*, pp. 962–967 Nov., 1990 entitled "Direct-Conversion FM Design".

Primary Examiner—Reinhard J. Eisenzopf
Assistant Examiner—Lisa Charouel
Attorney, Agent, or Firm—John J. Horn; M. Lee Murrah; H. Frederick Hamann

[57] ABSTRACT

A system for detecting and controlling gain and phase errors in a direct conversion receiver having a pair of signal channels carrying I and Q baseband signal components which are in quadrature and are a function of a phase angle $\theta$. The system operates by generating I' and Q' signals which correspond to $\sin(2\theta)$ and $\cos(2\theta)$. These I' and Q' signals are then normalized with respect to signal amplitude and filtered to produce signals $DC_I$ and $DC_Q$ corresponding to their DC components. The resulting signals $DC_I$ and $DC_Q$ have been discovered to be separately correlated with the gain and phase errors, respectively, and are used in adjusting the original I and Q baseband signal components to correct for any such errors existing between them.

30 Claims, 2 Drawing Sheets

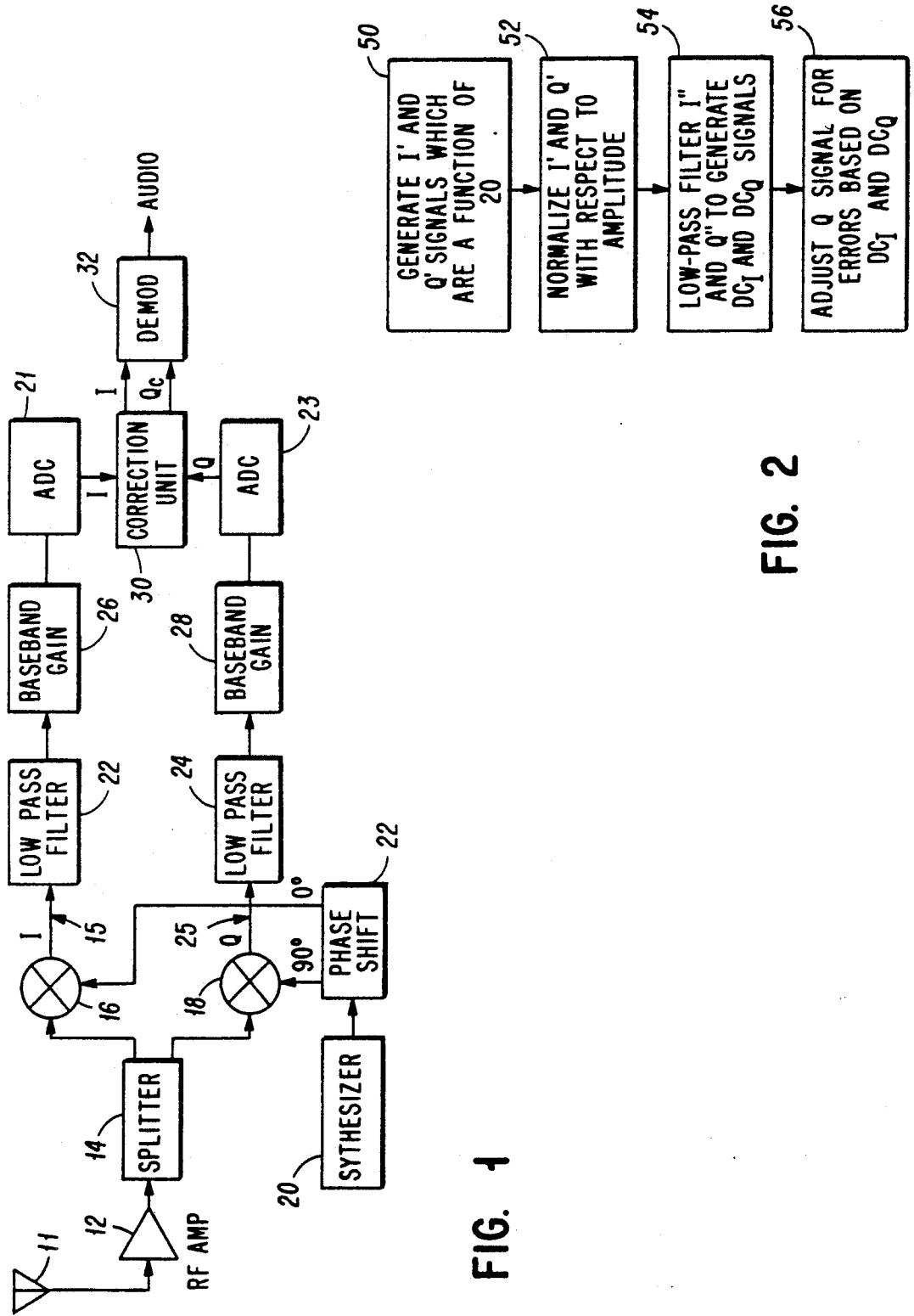

SYSTEM FOR CONTROLLING PHASE AND GAIN ERRORS IN AN I/Q DIRECT CONVERSION RECEIVER

BACKGROUND OF THE INVENTION

The present invention relates to radio communications technology and more particularly to direct conversion radio receivers.

At the present time the vast majority of radio receivers are of the superheterodyne type employing one or more intermediate frequency stages which allow for filtering and amplification at fixed frequencies. Alternatives have always existed to the superheterodyne architecture such as superregenerative and direct conversion designs. However, these alternative designs have been subject to serious flaws which have relegated radio receivers of these types to specialty roles within the radio communications world.

Despite the widespread adoption of the superheterodyne design, it has been widely recognized that the direct conversion architecture holds great promise for superior performance. For example, direct conversion receivers are not subject to image rejection problems and are not affected by cross-over spurious responses which are so often the cause of interference and related design difficulties in superheterodyne receivers. Further, direct conversion receivers feature simpler low-pass type filters operating at audio frequencies in contrast to the often bulky and expensive bandpass filters employed in superheterodyne receivers, require only a single injection signal at one frequency rather than multiple signals at different frequencies (multiple conversion sets), and provide a good potential for VLSI implementations since a majority of the receiver components consist of active audio and digital circuitry.

In a typical I/Q direct conversion receiver incoming RF communications signals are split into a pair of equal amplitude components which are in phase with each other. These RF components are then mixed with separate injection signals at approximately the same frequency as the communications signal but which are 90° out-of-phase with each other. I and Q baseband signal components which are in quadrature are thereby generated. These signals are then independently filtered and amplified at audio frequencies on separate signal channels. The I and Q components formed as a result of the mixing process allow the signal to be conveniently demodulated upon being supplied to a suitable signal processing unit.

This architecture works well except that it is very difficult to achieve and maintain identical gain and exact phase quadrature between the signal channels and variations between the signal channels which commonly occur as a result of changes in temperature, frequency and other operational parameters result in gain and phase mismatches with produce distortion products in the output of the receiver. Gain mismatches of as little as 0.2 dB and phase mismatches of as little as 1° can result in distortion products which can not ordinarily be reduced to less than 30–40 dB in practice and correspond to discrete tones which greatly limit the performance of the receiver.

Researchers investigating the design of direct conversion radio receivers have frequently recognized this limitation and a number of systems for correcting for errors between quadrature signal channels have been proposed. However, these systems have generally been specialized designs limited to the processing of signals of only a single modulation type. For example, U.S. Pat. No. 4,926,433 to Werner Reich entitled "Correction Circuit For A Digital Quadrature-Signal Pair" describes a correction system including an error-detecting stage for deriving amplitude, offset and phase errors from which correction signals are formed. However, error detection is limited to wideband FM signals characterized by quadrature signal pairs capable of forming an "elliptical locus" from which the errors can be determined by comparison with an ideal circle. In contrast, AM signals result in such a locus taking on irregular shapes from which proper error signals cannot be derived.

The publication by Bolliger and Vollenweider entitled "Some Experiments on Direct Conversion Receivers" in the proceedings of the Fifth International Conference on Radio Receivers and Associated Systems held Jul. 24–26, 1990 at Oxford, England describes a useful method for reducing the gain and phase errors between signal channels in an I/Q direct conversion receiver. In accordance with this method, new signals I' and Q' are formed which are equal to $Q^1-I^2$ and $2IQ$ where I and Q represent the original baseband components. If the expressions $Q^2-I^2$ and $2IQ$ are mathematically expanded, phase and gain errors may be seen to be primarily resident in DC terms which can be removed from the signals in order to reduce distortion. Accordingly, the I' and Q' signals are highpass filtered to suppress their DC components in order to produce derivative signals for direct use in demodulation which are characterized by reduced levels of gain and above errors.

The rationale for forming these signals may be readily understood with reference to the basic trigonometric identities $\cos(2\theta)=\cos^2(\theta) -\sin^2(\theta)$ and $\sin(2\theta)=2\cos(\theta)\sin(\theta)$. Since the signals I and Q are in quadrature, they may be seen to correspond to $\cos(\theta)$ and $\sin(\theta)$. Consequently, the expressions $Q^2-I^2$ and $2IQ$ are related to $2\theta$ which allows the original phase angle $\theta$ to be determined based on the signals I' and Q'.

This method of reducing distortion due to gain and phase errors between signal channels is highly useful but is limited to angle modulated signals since amplitude modulation would result in the DC terms being converted to low frequency AC components which would be resistant to filtering. Furthermore, this method does not provide for detection of the actual levels of the phase and gain errors and full and accurate correction for such errors on a continuing basis.

It is, therefore, an object of the present invention to provide an I/Q direct conversion radio receiver having a pair of signal channels carrying I and Q baseband signal components which are in quadrature which is characterized by superior performance due to the absence of distortion products arising from gain and phase errors between the signal channels.

It is another object of the present invention to provide a system of ruse in an I/Q direct conversion radio receiver which is adapted for processing signals of all modulation types and automatically detecting phase and gain errors resulting from mismatches between the signal channels within the receiver and fully correcting for such errors pursuant to a straightforward signal processing algorithm.

It is a yet further object of the present invention to provide a new system for controlling phase and gain errors in an I/Q direct conversion radio receiver which does not require specially generated calibration signals, is economic to construct, provides superior performance and may be substantially implemented in VLSI.

SUMMARY OF THE INVENTION

The present invention constitutes a system for controlling gain and phase errors resulting from mismatches between signal channels in a direct conversion receiver having a pair of signal channels adapted for carrying I and Q baseband signal components which are in quadrature. The system of the present invention operates by generating new I' and Q' signals on the basis of the I and Q baseband components. The I' and Q' signals are formed so as to correspond to $\cos(2\theta)$ and $\sin(2\theta)$ where $\theta$ represents the phase angle of which the original I and Q components are a function. The I' and Q' signals are then normalized with respect to signal amplitude in order to produce I'' and Q'' signals which are independent of amplitude effects. The resulting I'' and Q'' signals are then filtered to produce $DC_I$ and $DC_Q$ signals corresponding to their DC components. The $DC_I$ and $DC_Q$ signals have been discovered to closely correlate with the gain and phase errors inherent between the signal channels in the receiver. The $DC_I$ and $DC_Q$ signals are then used in adjusting the relationship between the original I and Q baseband components in order to correct for the gain and phase errors between the signal channels.

In the preferred embodiment, the present invention comprises a digital signal processing system configured for executing a set of signal processing routines adapted for performing the operations constituting the invention. The Q' and I' signals are formed by generating signals corresponding to the expressions $2IQ$ and $I^2-Q^2$ which equate to $\sin(2\theta)$ and $\cos(2\theta)$, respectively. These signals are then normalized by being divided by a signal corresponding to the expression $I^2+Q^2$ which represents signal magnitude. The resulting signals are lowpass filtered in order to isolate their DC components $DC_I$ and $DC_Q$ which correlate with the gain and phase errors in the receiver. The original Q baseband component is then adjusted with respect to its amplitude and phase relative to the I baseband component on the basis of the levels of the $DC_I$ and $DC_Q$ signals in order to correct the relationship between the I and Q components for gain and phase errors.

BRIEF DESCRIPTION OF THE DRAWINGS

FIG. 1 provides an overall block diagram of an I/Q direct conversion radio receiver which includes a correction unit operative in accordance with the principles of the present invention.

FIG. 2 provides a high level flowchart diagram depicting the most basic steps comprising the system of the present invention.

DESCRIPTION OF THE PREFERRED EMBODIMENT

Figure 3:
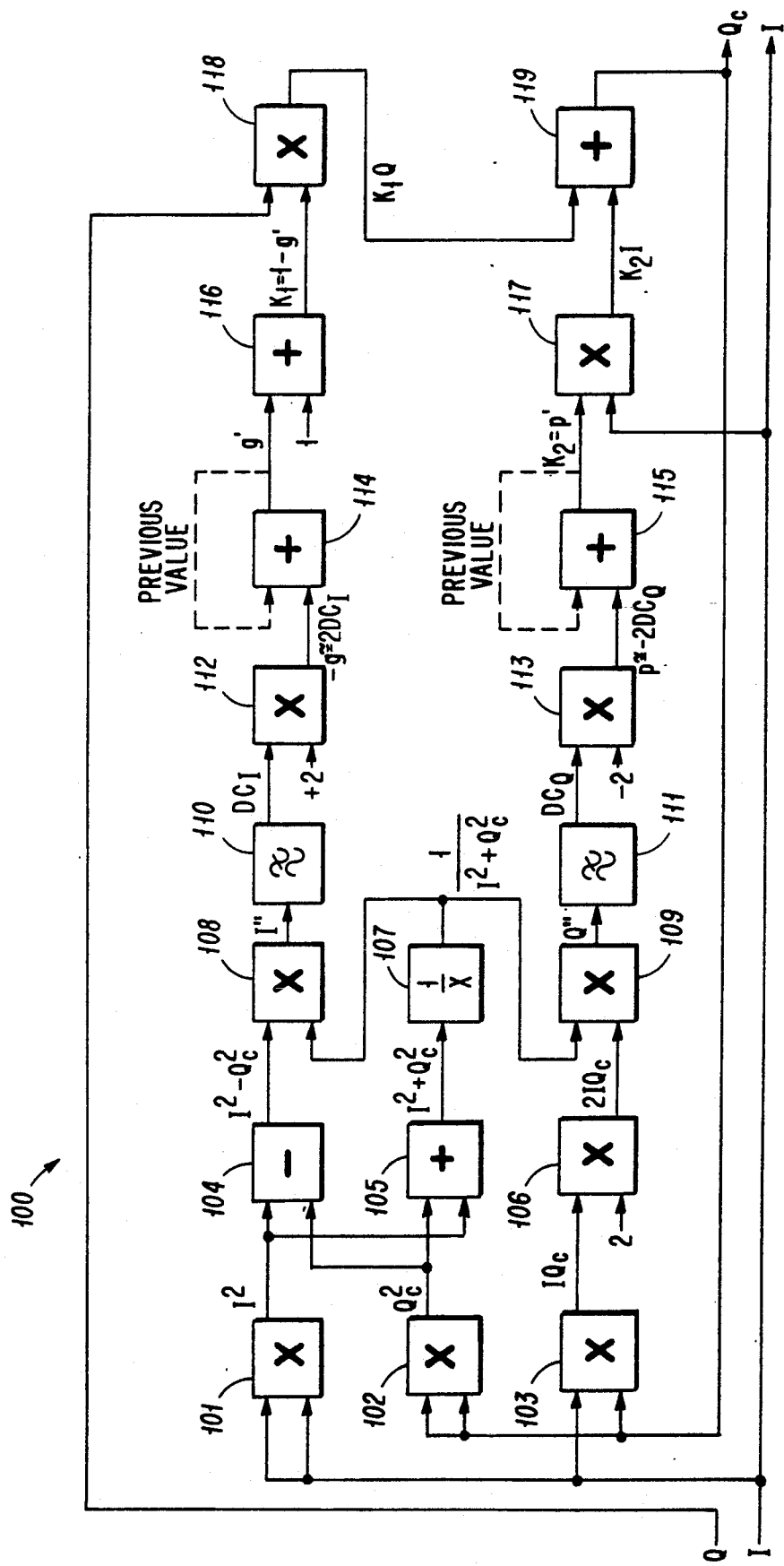
FIG. 3 provides a flowchart diagram of the steps for an algorithm in accordance with the principles of the present invention for use in a correction unit of the type shown in FIG. 1.

Referring now to FIG. 1, a direct conversion radio receiver 10 is shown having two baseband channels 15 and 25 for processing baseband signal components I and Q which are in quadrature (i.e., 90° out of phase). The receiver 10 includes a correction unit 30 for controlling phase and gain errors resulting from hardware mismatches between the signal channels. Reviewing the structure and operation of the radio receiver 10, radio frequency ("RF") communications signals picked up by the antenna 11 are supplied to the preamplifier 12 which provides a limited amount of RF gain. The output of the preamplifier 12 is passed to the splitter 14 which divides the signal into equal amplitude and in phase RF components which are then provided to the mixers 16 and 18. The synthesizer 20 generates an injection signal of approximately the same frequency as the specific communications signal intended to be received and processed by the radio receiver 10. The injection signal from the synthesizer 20 is passed to a phase shifting network 22 which splits the signal into equal amplitude but in quadrature components which are then supplied to the mixers 16 and 18.

The mixers 16 and 18 generate the I and Q baseband components as a product of the interaction of the signals from the phase shifter 22 and the RF signal components from the splitter 14. The baseband signal channels 15 and 25 include separate lowpass filter networks 22 and 24 which provide selectivity to the receiver 10 and separate baseband amplifier networks 26 and 28 which are the primary source of gain for the receiver 10. After being filtered in the filter networks 22 and 24 and amplified by the amplifier networks 26 and 28, the baseband signal components I and Q are supplied to the analog-to-digital convertors 21 and 23. The analog-to-digital convertors 21 and 23 convert the I and Q baseband components from analog to digital formats.

The resulting digitized I and Q baseband component signals are supplied to the correction unit 30. The correction unit 30 processes the digital I and Q signals in order to detect any phase and gain errors between the signal channels and accordingly adjust the relationship between the I and Q baseband components to correct for any such errors. The resulting corrected I and $Q_C$ baseband signal components are supplied to demodulator 32 which extracts the information carried by these signals and provides a corresponding audio output.

Referring now to FIG. 2, four steps, 50, 52, 54 and 56, are shown which comprise the fundamental operations by which the system of the present invention is functional for detecting and correcting gain and phase errors. In step 50, signals I' and Q' which are a function of 28 are generated by forming signals corresponding to the expressions $I^2-Q^2$ and $2IQ$, respectively. The I' and Q' signals are then normalized with respect to signal amplitude pursuant to step 52 by being divided by a signal corresponding to the expression $I^2+Q^2$ which represents signal magnitude. After being normalized, the signals are low pass filtered in step 54 in order to generate the signals $DC_I$ and $DC_Q$ which correspond to their DC components. The levels of the signals $DC_I$ and $DC_Q$ have been discovered to correlate with the gain and phase errors in the receiver resulting from mismatches between the signal channels carrying the I and Q baseband signal components. Accordingly, in step 56 the levels of the signals $DC_I$ and $DC_Q$ are used in adjusting the original Q component with respect to the original I (reference) component so that the components have substantially equal gain and are substantially 90° out-of-phase.

It should be noted that gain and phase errors are relative errors between the signal channels. Taking the I channel as the reference, gain error is equal to the variation of the amplitude of the Q channel relative to the I channel and phase error is equal to the variation of the Q channel from quadrature relative to the I channel.

Assuming, for purposes of background discussion, that a communications signal has unity magnitude and a phase of $\theta$, then its I and Q baseband signal components can be defined as $\cos(\theta)$ and $\sin(\theta)$, respectively. The phase angle $\theta$ may be determined from the I and Q components by calculating arctan Q/I as shown in equation (1) below:

$$\theta = \arctan(\tan(\theta)) = \arctan\frac{\sin(\theta)}{\cos(\theta)} = \arctan\frac{Q}{I} \quad (1)$$

The trigonometric functions $\cos(\theta)$ and $\sin(\theta)$ may be expressed in terms of common trigonometric identities and also in terms of I and Q as shown in equations (2) and (3) below:

(2) $\cos(2\theta) = \cos^2(\theta) - \sin^2(\theta) = I^2 - Q^2$ (3) $\sin(2\theta) = 2\cos(\theta)\sin(\theta) = 2IQ$ (It should be noted that $Q^2 - I^2$ would be functionally equivalent to $I^2 - Q^2$ with appropriate adjustments for the signs of the resulting terms.)

These identities open up the interesting possibility of defining analogs of I and Q which can be termed I' and Q' which are functions of $2\theta$ rather than $\theta$ as shown in equations (4) and (5) below:

(4) $I' = I^2 - Q^2$ (5) $Q' = 2IQ$

If I and Q don't represent a signal of unity magnitude as previously assumed, I' and Q' will be proportional to the square of signal magnitude. The magnitude of a signal can be determined from it's quadrature components by the well known relationship shown in equation (6) below:

(6) $magnitude = (I^2 + Q^2)^{\frac{1}{2}}$

Therefore, I' and Q' can be normalized to be independent of signal amplitude (including amplitude modulation) by dividing by the square of signal magnitude in order to produce new I'' and Q'' signals as defined in equations (7) and (8) below:

$$I'' = \frac{I^2 - Q^2}{I^2 + Q^2} \quad (7)$$

$$Q'' = \frac{2IQ}{I^2 + Q^2} \quad (8)$$

It has been discovered that when gain and phase errors are present I'' and Q'' have average DC levels and that the DC component level of I'' is closely correlated with gain error while the DC component level of Q'' is closely correlated with phase error.

The Q baseband component may be expressed in terms of gain error g and phase error p as shown in equation (9) below:

$$Q = (1+g)\sin(\theta - p)$$

Further, if $DC_I$ is defined as the DC component value of I'' and $DC_Q$ is defined as the DC component value of Q'', then the gain error g and phase error p may be expressed in terms of $DC_I$ and $DC_Q$ as shown in equations (10) and (11) below:

$$g = \frac{-2DC_I}{1 + DC_I} \quad \text{(when } p = 0\text{)} \quad (10)$$

(11) $p = -2\arctan(DC_Q)$ (when $g = 0$)

It should be noted that equations (10) and (11) appear to be exact when only gain errors or only phase errors are present, but these equations are subject to slight errors when both gain and phase errors are simultaneously present.

Once values for the gain error g and the phase error p in a direct conversion receiver have been determined, corrections can then be applied to the original Q signal component and a corrected signal component $Q_C$ can be generated and then used along with the original I signal (defined as the reference and assumed to be error free) for further processing and demodulation of the communications signal. The corrected signal $Q_C$ can be obtained from I, Q, p and g in accordance with equations (12), (13) and (14) shown below:

$$Q_C = k_1 Q + k_2 I \text{ where} \quad (12)$$

$$k_1 = \frac{1}{(1+g)\cos(p)} \text{ and} \quad (13)$$

(14) $k_2 = \tan(p)$ \quad (14)

The expressions shown in equations (13) and (14) can be simplified for signal processing purposes to reasonably accurate approximations as shown in equations (15), (16), (17) and (18) below:

$$g = \frac{-2DC_I}{1 + DC_I} \approx -2DC_I \quad (15)$$

$$p = -2\arctan(DC_Q) \approx -\arctan(2DC_Q) \quad (16)$$

$$k_1 = \frac{1}{(1+g)\cos(p)} \approx 1 - g \approx 1 + 2DC_I \quad (17)$$

$$k_2 = \tan(p) \approx -2DC_Q \quad (18)$$

The effects of the imperfections in the algorithm for determining the gain and phase errors and the effects of the approximations shown above may be illustrated to be minimal by way of example. If the Q channel has a gain error of 3% and a phase error of 5° then the value of $DC_I$ would be $-0.01481$ and the value of $DC_Q$ would be $-0.04365$. Using equations 12 and 18, the phase error would be calculated to be 4.9894° with a "correction" error of 0.0105°. Using equations 12 and 17, the gain error would be calculated to be 3.0633%, with a "correction" error of 0.0633%. The errors due to imperfections in the algorithm and approximations made for purposes of simplifying the signal processing algorithms are minor for most purposes.

Referring now to FIG. 3, the digital signal processing software module 100 includes steps 101-119 which are operative for detecting gain and phase errors and correcting the Q baseband signal component to form a corrected signal component $Q_C$ which is substantially free of distortion due to gain and phase errors. The I' and Q' signals which representing $\cos(2\theta)$ and $\sin(2\theta)$ are formed from the "original" baseband component I· and the corrected baseband component $Q_C$ in steps 101–109. In steps 101, 102 and 103 multiplication operations are performed on the I and $Q_C$ components to form signals corresponding to $I^2$, $Q_C^2$ and $IQ_C$, respectively. Pursuant to steps 104 and 105 subtraction and addition operations are performed to generate signals corresponding to the expressions $I^2 - Q_C^2$ and $I^2 + Q_C^2$, respectively. In step 106 the $IQC$ signal produced pursuant to step 103 is multiplied by a factor of 2 in order to produce a signal corresponding to $2IQ_C$.

In accordance with step 107 a reciprocation operation is performed on the signal produced in step 105 in order to form a signal corresponding to the expression $1/(I^2 + Q_C2)$ for use in steps 108 and 109. The I" and Q" signals are then generated in steps 108 and 109 as multiplication operations are performed with the signals representing $I^2 - Q_C^2$ and $2IQ_C$ produced in steps 104 and 106, respectively. Steps 108 and 109 are functional for normalizing the signals produced in steps 104 and 106 by dividing these signals by a signal representing combined magnitude although the required division operations are performed by multiplying by a reciprocal.

In steps 110 and 111, the I" and Q" signals are low-pass filtered to isolate their DC components and generate the signals $DC_I$ and $DC_Q$ corresponding to these components which have been discovered to be correlated in value with the gain and phase errors in the receiver.

The signals $DC_I$ and $DC_Q$ are supplied for use in steps 112–119 whereby signals approximating the actual gain and phase errors are generated and the Q baseband component is corrected to form the $Q_C$ signal component. In steps 112 and 113 the $DC_I$ and $DC_Q$ signals are separately multiplied by factors of 2 and −2 to form the error signals g and p approximating the gain and phase errors between the signal channels in the receiver. Pursuant to steps 114 and 115 the current error signals g and p are added to the values of the error signals g and p calculated pursuant to the previous iteration of the error calculation algorithm. This approach allows for progressively improving approximations of the gain and phase errors existing between the signal channels to be computed on an iterative basis as corrections are applied to the Q baseband component.

The iteratively generated gain error signal g' produced in step 114 is supplied for use in step 116 where it is added to a signal having the unit value to form the correction coefficient $k_1$. In step 118 the coefficient $k_1$ is then multiplied by the original baseband component Q in order to form a signal corresponding to $k_1Q$ which is supplied for use in step 119. The iteratively generated phase error signal p' which is equal to the correction coefficient $k_2$ is supplied for use in step 117 where it is multiplied by the original I baseband component to form a signal corresponding to $k_2I$ which is supplied for use in step 119. In step 119 the $k_1Q$ and $k_2I$ signals generated in steps 118 and 117 are added together in order to produce the final corrected baseband signal component $Q_C$ which is then supplied for use in demodulation and for use in steps 102 and 103 in deriving new values of the gain and phase error signals g and p pursuant to the next iteration of the algorithm for calculating the values of these errors.

It should be noted that steps 117, 118 and 119 should be performed for every sample of the digitized baseband components I and Q so that a properly corrected $Q_C$ component value can be produced on a continuous basis. Conversely, steps 101 through 111 are not required to be performed for every signal sample although samples must be chosen in an unbiased fashion and sufficient samples must be processed to provide valid DC levels at the outputs of the filtering steps 110 and 111. Steps 112–116 are required to be performed only once each time the correction coefficients $k_1$ and $k_2$ are updated. After each such update, sufficient time must be allowed for the outputs of the low-pass filter steps 110 and 112 to stabilize before the correction coefficients are updated again. The degree of convergence of the algorithm can be monitored by observing the levels of the outputs of steps 110 and 111 since as convergence is achieved these outputs should approach zero in value.

While particular embodiments of the present invention have been shown and described, it should be clear that changes and modifications may be made to such embodiments without departing from the true scope and spirit of the invention. For example, if only angle modulated signals such as FM are to be processed by the receiver, then it may not be necessary to normalize the I' and Q' signals. Consequently, steps 105, 107, 108 and 109 could be eliminated from software module 100 although the receiver would probably be subject to the effects of increased amplitude noise. By way of further example, given careful selection of receiver components to achieve matching of gain characteristics between the signal channels, it might only be necessary to detect and adjust for phase mismatches between the signal channels in the receiver and steps 104, 108, 110, 112, 114, 116 and 118 could be eliminated from software module 100. It is intended that the appended claims cover all such changes and modifications.

I claim:
1. A system for controlling phase and gain errors in a direct conversion receiver having a pair of signal channels carrying I and Q baseband signal components which are in quadrature and which are a function of a phase angle $\theta$, said system comprising:
   (a) means for forming new I' and Q' signals which correspond to expressions $\sin(2\theta)$ and $\cos(2\theta)$ from said I and Q components;
   (b) means for normalizing said I' and Q' signals with respect to signal amplitude in order to produce normalized signals I" and Q";
   (c) means for filtering said I" and Q" signals in order to generate signals $DC_I$ and $DC_Q$ corresponding to DC components of said I" and Q" signals; and
   (d) means for said correcting for gain and phase errors between said I and Q components based on values of said $DC_I$ and $DC_Q$ signals.

2. The system of claim 1, in which said means for forming the new I' and Q' signals includes means for forming signals substantially corresponding to expressions $2IQ$ and $I^2 - Q^2$ which represent said $\sin(2\theta)$ and said $\cos(2\theta)$.

3. The system of claim 2, in which said means for normalizing said I' and Q' signals includes means for dividing said I' and Q' signals by a signal corresponding to an expression $I^2 + Q^2$ which represents signal magnitude.

4. The system of claim 2, in which said means for filtering said I" and Q" signals includes a pair of low-pass filters for separately filtering said I" and Q" signals.

5. The system of claim 2, in which said means for correcting for said gain and phase errors includes means for forming a signal corresponding to an expression $K_1Q + K_2I$ where:

$K_1 = 1/(1+g)\cos p,$ $K_2 = \tan p, q = 2DC_I$ and $p = 2DC_Q.$

6. A method of controlling gain and phase errors in a direct conversion receiver having a pair of signal channels carrying I and Q baseband signal components which are in quadrature and which are a function of a phase angle $\theta$, said method comprising the steps of:
   (a) generating new I' and Q' signals from said I and Q components which are in quadrature and are a function of a phase angle $2\theta$;
   (b) normalizing said I' and Q' signals with respect to signal amplitude in order to produce normalized signals I'' and Q'';
   (c) low-pass filtering said I'' and Q'' signals in order to generate $DC_I$ and $DC_Q$ signals which correspond to DC components of said I'' and Q'' signals; and
   (d) adjusting gain and phase relationship between said I and Q components in order to correct for said gain or phase errors based on the values of the said $DC_I$ and $DC_Q$ signals.

7. The method of claim 6, in which said step of generating the I' and Q' signals is performed by forming signals corresponding to expressions $2IQ$ and $I^2-Q^2$ which represent $\sin(2\theta)$ and $\cos(2\theta)$.

8. The method of claim 6, in which said step of normalizing said I' and Q' signals is performed by dividing said I' and Q' signals by a signal substantially corresponding to an expression $I^2+Q^2$ which represents signal magnitude.

9. A method of detecting and quantifying gain and phase mismatch errors between signal channels in a direct conversion receiver having a pair of signal channels carrying I and Q baseband signal components which are in quadrature, said method comprising the steps of:
   (a) generating I' and Q' signals substantially corresponding to expressions $2IQ$ and $I^2-Q^2$;
   (b) normalizing said I' and Q' signals with respect to signal amplitude in order to produce normalized I'' and Q'' signals; and
   (c) low-pass filtering said I'' and Q'' signals in order to produce $DC_I$ and $DC_Q$ signals which are indicative of said gain and phase errors in said direct conversion receiver.

10. The method of claim 9, in which said step of normalizing said I' and Q' signals includes the step of separately dividing said I' and Q' signals by a signal substantially corresponding to an expression $I^2+Q^2$.

11. A system for controlling phase and gain errors in a direct conversion receiver having a pair of signal channels carrying I and Q baseband signal components which are in quadrature and which are a function of a phase angle $\theta$, said system comprising:
   (a) means for forming I' and Q' signals corresponding to the expressions $\sin(2\theta)$ and $\cos(2\theta)$;
   (b) means for filtering said I' and Q' signals in order to generate signals $DC_I$ and $DC_Q$ corresponding to DC components of said I' and Q' signals; and
   (c) means for correcting for said phase and gain errors between said I and Q signal components based on values of said $DC_I$ and $DC_Q$ signals.

12. The system of claim 11, in which said means for forming the I' and Q' signal components includes means for forming signals substantially corresponding to expressions $2IQ$ and $I^2-Q_2$ which represent said $\sin(2\theta)$ and said $\cos(2\theta)$.

13. The system of claim 12, further including means for normalizing said I' and Q' signals by separately dividing said I' and Q' signals by a signal corresponding to an expression $I^2+Q^2$ which represents signal magnitude.

14. The system of claim 12, in which said means for filtering includes a pair of low-pass filters for separately filtering said I' and Q' signals.

15. A method of detecting and quantifying gain and phase errors between signal channels in a direct conversion receiver having a pair of signal channels carrying I and Q baseband signal components which are in quadrature, said method comprising the steps of:
   (a) generating I' and Q' signals substantially corresponding to expressions $2IQ$ and $I^2-Q^2$; and
   (b) low-pass filtering said I' and Q' signals in order to produce $DC_I$ and $DC_Q$ signals which are indicative of said gain and phase errors in said direct conversion receiver.

16. The method of claim 15, further including the step of normalizing said I' and Q' signals by separately dividing said I' and Q' signals by a signal corresponding to an expression $I^2+Q^2$ representing signal magnitude.

17. A system for controlling phase errors in a direct conversion receiver having a pair of signal channels carrying I and Q baseband signal components which are in quadrature and which are a function of a phase angle $\theta$, said system comprising:
   (a) means for forming a new Q' signal which corresponds to expression $\sin(2\theta)$ from said I and Q components;
   (b) means for normalizing said Q' signal with respect to signal amplitude in order to produce a normalized signal Q'';
   (c) means for low-pass filtering said Q'' signal in order to generate a signal $DC_Q$ corresponding to DC component of said Q'' signal; and
   (d) means for correcting for said phase errors between said I and Q components based on value of said $DC_Q$ signal.

18. The system of claim 17, in which said means for forming the new Q' signal includes means for forming a signal substantially corresponding to an expression $2IQ$ which represents said $\sin(2\theta)$.

19. The system of claim 18, in which said means for normalizing said Q' signal includes means for dividing said Q' signal by a signal corresponding to an expression $I^2+Q^2$ which represents signal magnitude.

20. A system for controlling gain errors in a direct conversion receiver having a pair of signal channels carrying I and Q baseband signal components which are in quadrature and which are a function of a phase angle $\theta$, said system comprising:
   (a) means for forming a new I' signal which corresponds to an expression $\cos(2\theta)$ from said I and Q components;
   (b) means for normalizing said I' signal with respect to signal amplitude in order to produce a normalized signal I'';
   (c) means for low-pass filtering said I'' signal in order to generate a signal $DC_I$ corresponding to a DC component of said I'' signal; and (d) means for correcting for said gain errors between said I and Q components based on a value of said $DC_I$ signal.

21. The system of claim 20, in which said means for forming the new I' signal includes means for forming a signal substantially corresponding to an expression $I^2 - Q^2$ which represents said $\cos(2\theta)$.

22. The system of claim 21, in which said means for normalizing said I' signal includes means for dividing said I' signal by a signal corresponding to an expression $I^2 + Q^2$ which represents signal magnitude.

23. A method of detecting and quantifying phase errors between signal channels in a direct conversion receiver having a pair of signal channels carrying I and Q baseband signal components which are in quadrature, said method comprising the steps of:
    (a) generating a Q' signal substantially corresponding to an expression 2IQ;
    (b) normalizing said Q' signal with respect to signal amplitude in order to produce a normalized Q'' signal; and
    (c) low-pass filtering said Q'' signal in order to produce a $DC_Q$ signal which is indicative of said phase errors in said direct conversion receiver.

24. The method of claim 23, in which said step of normalizing the Q' signal includes the step of dividing said Q' signal by a signal substantially corresponding to an expression $I^2 + Q^2$.

25. A method of detecting and quantifying gain errors between signal channels in a direct conversion receiver having a pair of signal channels carrying I and Q baseband signal components which are in quadrature, said method comprising the steps of:
    (a) generating an I' signal substantially corresponding to an expression $I_2 - Q_2$;
    (b) normalizing said I' signal with respect to signal amplitude in order to produce a normalized I'' signal; and
    (c) low-pass filtering said I'' signal in order to produce a $DC_I$ signal which is indicative of said gain errors in said direct conversion receiver.

26. The method of claim 25, in which said step of normalizing said I' signal includes the step of dividing said I' signal by a signal substantially corresponding to an expression $I^2 + Q^2$.

27. A system for controlling phase errors in a direct conversion receiver having a pair of signal channels carrying I and Q baseband signal components which are in quadrature and which are a function of a phase angle $\theta$, said system comprising:
    (a) means for forming a Q' signal corresponding to an expression $\sin(2\theta)$;
    (b) means for low-pass filtering said Q' signal in order to to generate a signal $DC_Q$ corresponding to a DC component of said Q' signal; and
    (c) means for correcting for said phase errors between said I and Q signal components based on a value of said $DC_Q$ signal.

28. The system of claim 27, in which said means for forming said Q' signal includes means for forming a signal substantially corresponding to an expression 2IQ which represents said $\sin(2\theta)$.

29. A system for controlling gain errors in a direct conversion receiver having a pair of signal channels carrying I and Q baseband signal components which are in quadrature and which are a function of a phase angle $\theta$, said system comprising:
    (a) means for forming a I' signal corresponding to an expression $\cos(2\theta)$;
    (b) means for low-pass filtering said I' signal in order to to generate a signal $DC_I$ corresponding to a DC component of said I' signal; and
    (c) means for correcting for said gain errors between said I and Q signal components based on a value of said $DC_I$ signal.

30. The system of claim 29, in which said means for forming said I' signal includes means for forming a signal substantially corresponding to an expression $I_2 - Q_2$ which represents said $\cos(2\theta)$.

* * * * *